United States Patent
Yoo et al.

(10) Patent No.: US 8,410,542 B2
(45) Date of Patent: Apr. 2, 2013

(54) CHARGE-TRAPPING NONVOLATILE MEMORY DEVICES HAVING GATE STRUCTURES THEREIN WITH IMPROVED BLOCKING LAYERS

(75) Inventors: Dong-Chul Yoo, Seongnam-si (KR); Byong-Ju Kim, Suwon-si (KR); Han-Mei Choi, Seoul (KR); Ki-Hyun Hwang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 120 days.

(21) Appl. No.: 12/938,006

(22) Filed: Nov. 2, 2010

(65) Prior Publication Data
US 2011/0101438 A1    May 5, 2011

(30) Foreign Application Priority Data
Nov. 3, 2009 (KR) .......................... 10-2009-0105257

(51) Int. Cl.
*H01L 29/792* (2006.01)
(52) U.S. Cl. ................ 257/324; 257/411; 257/E29.309
(58) Field of Classification Search .................. 257/314, 257/324–326, 410, 411, E29.309
See application file for complete search history.

(56) References Cited

U.S. PATENT DOCUMENTS

| | | | | |
|---|---|---|---|---|
| 2008/0169502 | A1* | 7/2008 | Joshi et al. | 257/324 |
| 2009/0039414 | A1* | 2/2009 | Lue et al. | 257/324 |
| 2009/0212351 | A1* | 8/2009 | Chen | 257/324 |

FOREIGN PATENT DOCUMENTS

| | | | |
|---|---|---|---|
| KR | 1020060104717 A | | 10/2006 |
| KR | 1020070001454 A | | 1/2007 |
| KR | 100753079 B1 | * | 8/2007 |
| KR | 100753079 B1 | | 8/2007 |
| KR | 1020080030274 A | | 4/2008 |

* cited by examiner

*Primary Examiner* — Marcos D. Pizarro
(74) *Attorney, Agent, or Firm* — Myers Bigel Sibley & Sajovec, P.A.

(57) ABSTRACT

Nonvolatile memory devices include a tunnel insulating layer on a substrate and a charge storing layer on the tunnel insulating layer. A charge transfer blocking layer is provided on the charge storing layer. The charge transfer blocking layer is formed as a composite of multiple layers, which include a first oxide layer having a thickness of about 1 Å to about 10 Å. This first oxide layer is formed directly on the charge storing layer. The charge transfer blocking layer includes a first dielectric layer on the first oxide layer. The charge transfer blocking layer also includes a second oxide layer on the first dielectric layer and a second dielectric layer on the second oxide layer. The first and second dielectric layers have a higher dielectric constant relative to the first and second oxide layers, respectively. The memory cell includes an electrically conductive electrode on the charge transfer blocking layer.

20 Claims, 9 Drawing Sheets

CHARGE-TRAPPING NONVOLATILE MEMORY DEVICES HAVING GATE STRUCTURES THEREIN WITH IMPROVED BLOCKING LAYERS

REFERENCE TO PRIORITY APPLICATION

This application claims priority under 35 USC §119 to Korean Patent Application No. 10-2009-105257, filed Nov. 3, 2009 in the Korean Intellectual Property Office (KIPO), the contents of which are hereby incorporated herein by reference in their entirety.

FIELD OF THE INVENTION

The present invention relates to gate structures of a flash memory device and methods of manufacturing the same.

BACKGROUND OF THE INVENTION

A charge trap flash memory device may include a blocking layer pattern between a charge trapping layer pattern and a gate electrode. When a stored charge in the charge trapping layer pattern flows to a substrate during an erase mode, back tunneling may occur through the blocking layer pattern. Therefore, the erase saturation characteristics of the flash memory device may deteriorate, and the flash memory device may have poor reliability.

SUMMARY OF THE INVENTION

Nonvolatile memory devices according to embodiments of the invention include an array of nonvolatile memory cells (e.g., charge-trap type and floating gate type memory cells). Each of the nonvolatile memory cells may include a tunnel insulating layer on a substrate and a charge storing layer on the tunnel insulating layer. A charge transfer blocking layer is provided on the charge storing layer. This charge transfer blocking layer inhibits leakage currents passing therethrough during memory programming and erase operations. The charge transfer blocking layer may be formed as a composite of multiple layers. According to some embodiments of the invention, the charge transfer blocking layer may include a first oxide layer having a thickness in a range from about 1 Å to about 10 Å. This first oxide layer may be formed directly on (e.g., in contact with) the charge storing layer. The charge transfer blocking layer may also include a first dielectric layer on the first oxide layer. This first dielectric layer may have a higher dielectric constant relative to the first oxide layer. The charge transfer blocking layer also includes a second oxide layer on the first dielectric layer and a second dielectric layer on the second oxide layer. This second dielectric layer may have a higher dielectric constant relative to the second oxide layer. This second dielectric layer may have a thickness in a range from about 30 Å to about 100 Å. The memory cell may also include an electrically conductive electrode on the charge transfer blocking layer.

According to additional embodiments of the invention, the first and second dielectric layers may be formed of the same material and the first and/or second dielectric layer may be formed of a material selected from a group consisting of aluminum oxide, hafnium oxide, zirconium oxide, lanthanum oxide, lanthanum hafnium oxide and hafnium aluminum oxide. According to still further embodiments of the invention, the nonvolatile memory device may include a charge-trap type device and the charge storing layer may include a material selected from a group consisting of silicon nitride and hafnium silicon oxide. Alternatively, the charge storing layer may be formed as a polycrystalline silicon layer, which operates as a floating gate electrode. According to additional aspects of these embodiments of the invention, the charge transfer blocking layer may directly contact the charge storing layer, the first dielectric layer may directly contact the first oxide layer and the second dielectric layer may directly contact the second oxide layer. The electrically conductive electrode may also directly contact the second dielectric layer.

BRIEF DESCRIPTION OF THE DRAWINGS

Example embodiments of the invention will be more clearly understood from the following detailed description taken in conjunction with the accompanying drawings. FIGS. 1 to 16 represent non-limiting, example embodiments as described herein.

DETAILED DESCRIPTION OF THE EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, example embodiments will be explained in detail with reference to the accompanying drawings.

Figure 1:
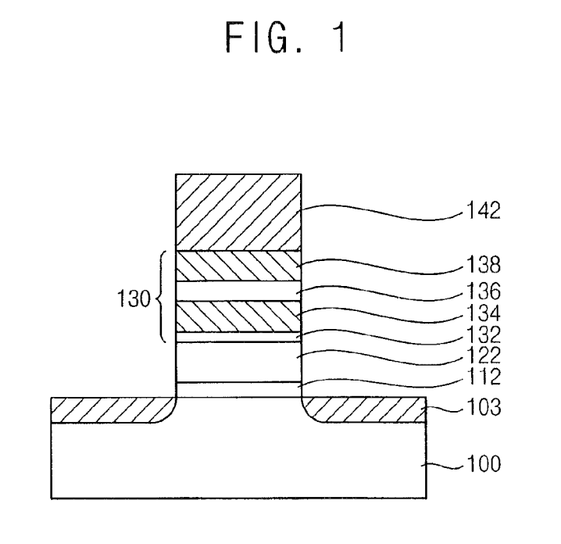
FIG. 1 is a cross-sectional view illustrating a first gate structure in accordance with example embodiments.

FIG. 1 is a cross-sectional view illustrating a first gate structure in accordance with example embodiments. Referring to FIG. 1, the first gate structure may include a tunnel insulation layer pattern 112, a charge trapping layer pattern 122, a blocking layer pattern 130 and a gate electrode 142 sequentially stacked on a substrate 100. The substrate 100 may include a semiconductor substrate such as a silicon substrate, a germanium substrate, a silicon-germanium substrate, a silicon-on-insulator (SOI) substrate, a germanium-on-insulator (GOI) substrate, etc. The substrate 100 may further have a well region (not shown) including n-type impurities or p-type impurities. The tunnel insulation layer pattern 112 may include an oxide such as silicon oxide, a nitride such as silicon nitride, or a metal oxide such as hafnium silicon oxide, zirconium silicon oxide, lanthanum aluminum oxide, hafnium aluminum oxide, etc. The charge trapping layer pattern 122 may include a nitride such as silicon nitride or a hafnium oxide such as hafnium silicon oxide. The blocking layer pattern 130 may include a first silicon oxide layer pattern 132, a first high-k dielectric layer pattern 134, a second silicon oxide layer pattern 136 and a second high-k dielectric layer pattern 138 sequentially stacked on the charge trapping layer pattern 122. The high-k dielectric refers to a material having a high dielectric constant.

The first silicon oxide layer pattern 132 may include a silicon oxide and may have a thickness of less than about 10 Å. In an example embodiment, the first silicon oxide layer pattern 132 may have a thickness of more than about 1 Å.

The first high-k dielectric layer pattern 134 may include a high-k material such as aluminum oxide, hafnium oxide, lanthanum oxide, lanthanum aluminum oxide, lanthanum hafnium oxide, hafnium aluminum oxide, titanium oxide, tantalum oxide, zirconium oxide, etc. These may be used alone or in a mixture thereof. In an example embodiment, the first high-k dielectric layer pattern 134 may have a thickness of about 10 to about 30 Å.

The second silicon oxide layer pattern 136 may include a material substantially the same as that of the first silicon oxide layer pattern 132, and may have a thickness greater than that of the first silicon oxide layer pattern 132. In an example embodiment, the second silicon oxide layer pattern 136 may have a thickness of about 10 to about 30 Å.

The second high-k dielectric layer pattern 138 may include a material substantially the same as that of the first high-k dielectric layer pattern 134. In an example embodiment, the second high-k dielectric layer pattern 138 may have a thickness substantially the same as that of the first high-k dielectric layer pattern 134. Alternatively, the second high-k dielectric layer pattern 138 may have a thickness different from that of the first high-k dielectric layer pattern 134.

The gate electrode 142 may include polysilicon, a metal, a metal nitride, a metal silicide, etc. In an example embodiment, the gate electrode 142 may include a polysilicon layer pattern (not shown), an ohmic contact (not shown), a diffusion barrier layer pattern (not shown), an amorphous layer pattern (not shown) and a metal layer pattern (not shown) sequentially stacked on the blocking layer pattern 130. The polysilicon layer pattern may include p-type impurities such as boron, indium, gallium, etc., or n-type impurities such as phosphorus, arsenic, antimony, etc. The ohmic contact may include a metal that has a high resistivity and a high melting point such as titanium, tantalum, tungsten, molybdenum or alloys thereof. The diffusion barrier layer pattern may include a metal nitride such as tungsten nitride, titanium nitride, tantalum nitride, molybdenum nitride, etc. The amorphous layer pattern may include amorphous silicon or a metal silicide having a high melting point such as amorphous titanium silicide, amorphous molybdenum silicide or amorphous tantalum silicide. The metal layer pattern may include a metal having a high melting point such as tungsten, titanium, tantalum, molybdenum, or alloys thereof.

An impurity region 103 may be formed at an upper portion of the substrate 100 adjacent to the first gate structure. The first gate structure and the active region 103 may serve as a transistor in a charge trap flash memory device.

Figure 2:
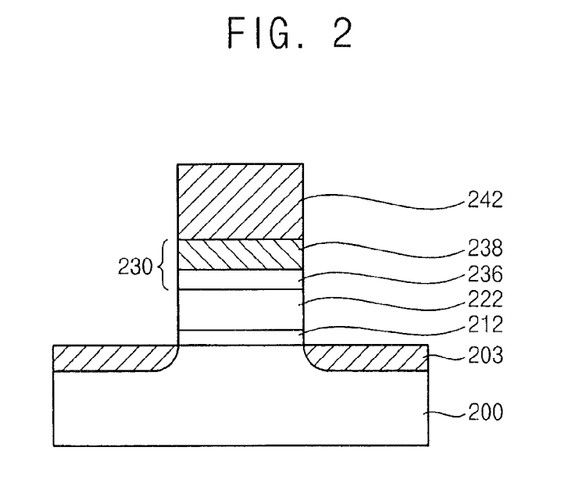
FIG. 2 is a cross-sectional view illustrating a second gate structure in accordance with Comparative Example 1.
Figure 3:
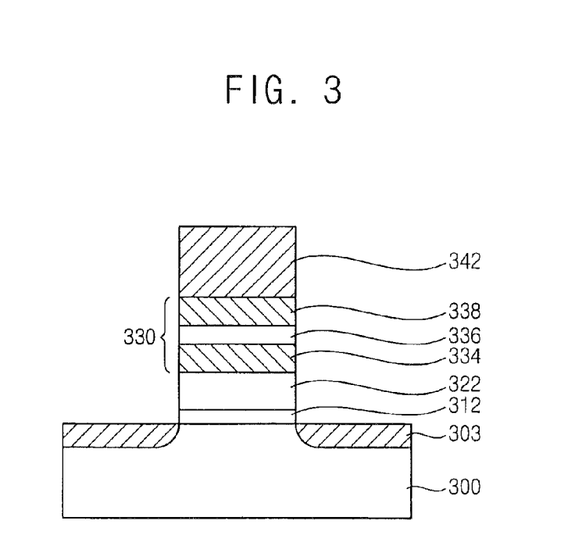
FIG. 3 is a cross-sectional view illustrating a third gate structure in accordance with Comparative Example 2.

FIG. 2 is a cross-sectional view illustrating a second gate structure in accordance with Comparative Example 1, and FIG. 3 is a cross-sectional view illustrating a third gate structure in accordance with Comparative Example 2. The second and third gate structures are substantially the same as or similar to the first gate structure in accordance with example embodiments except for the blocking layer patterns.

Referring to FIG. 2, the second gate structure may include a tunnel insulation layer pattern 212, a charge trapping layer pattern 222, a blocking layer pattern 230 and a gate electrode 242 sequentially stacked on a substrate 200. The blocking layer pattern 230 may include a silicon oxide layer pattern 236 and a high-k dielectric layer pattern 238 sequentially stacked on the charge trapping layer pattern 222. The silicon oxide layer pattern 236 may include silicon oxide. The high-k dielectric layer pattern 238 may include a high-k material such as aluminum oxide, hafnium oxide, lanthanum oxide, lanthanum aluminum oxide, lanthanum hafnium oxide, hafnium aluminum oxide, titanium oxide, tantalum oxide, zirconium oxide, etc. These may be used alone or in a mixture thereof.

Referring to FIG. 3, the third gate structure may include a tunnel insulation layer pattern 312, a charge trapping layer pattern 322, a blocking layer pattern 330 and a gate electrode 342 sequentially stacked on a substrate 300. The blocking layer pattern 330 may include a first high-k dielectric layer pattern 334, a silicon oxide layer pattern 336 and a second high-k dielectric layer pattern 338 sequentially stacked on the charge trapping layer pattern 322. The silicon oxide layer pattern 336 may include silicon oxide. The first and second high-k dielectric layer patterns 334 and 338 may include a high-k material such as aluminum oxide, hafnium oxide, lanthanum oxide, lanthanum aluminum oxide, lanthanum hafnium oxide, hafnium aluminum oxide, titanium oxide, tantalum oxide, zirconium oxide, etc. These may be used alone or in a mixture thereof.

A non-uniform interfacial layer (not shown) may be further formed between the charge trapping layer pattern 322 and the first high-k dielectric layer pattern 334 during the formation thereof. Particularly, when a heat treatment for forming the first high-k dielectric layer pattern 334 is performed, some elements of the charge trapping layer pattern 322 (e.g., silicon nitride) and the first high-k dielectric layer pattern 334 (e.g., aluminum oxide) may be dissociated therefrom and/or combined with each other to form an undesired layer between the charge trapping layer pattern 322 and the first high-k dielectric layer pattern 334. For example, the non-uniform interfacial layer may include aluminum oxynitride, aluminum silicon oxide or aluminum silicon oxynitride. The non-uniform interfacial layer may increase a resistance of the third gate structure and may deteriorate a performance of a transistor having the third gate structure.

Figure 4A:
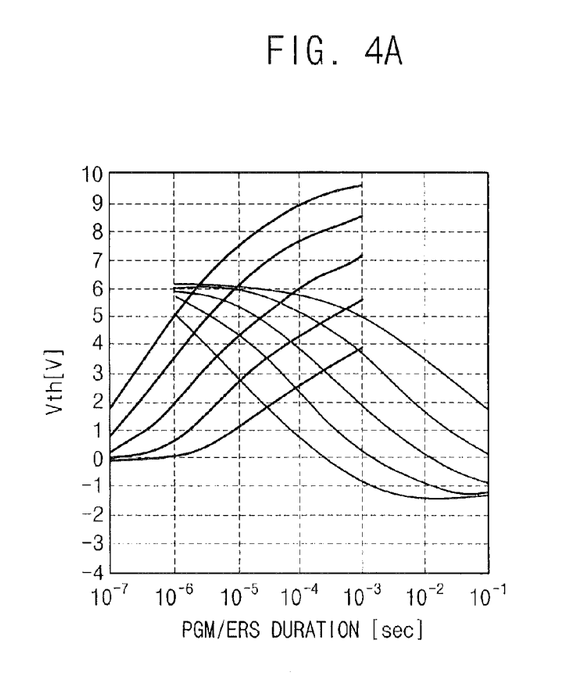
FIGS. 4A, 4B and 4C are graphs illustrating an erase performance (i.e., erase saturation characteristics) of transistors having second, third and first gate structures, respectively.
Figure 4B:
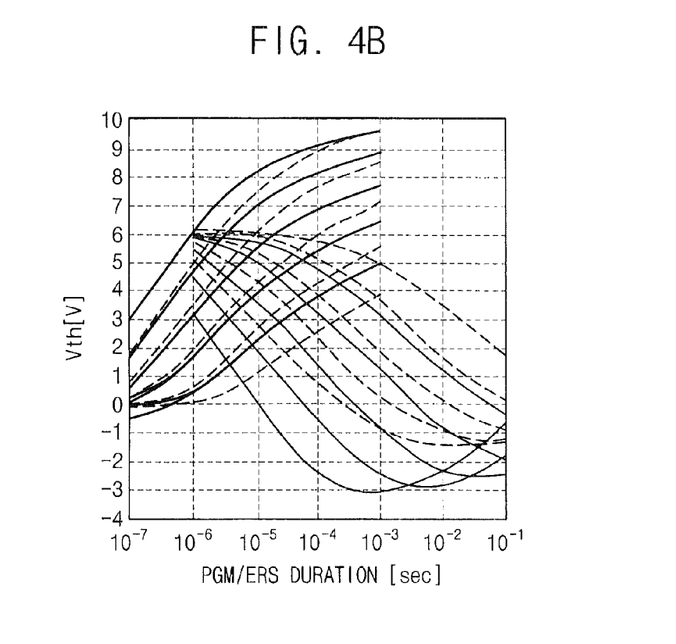
Figure 4C:
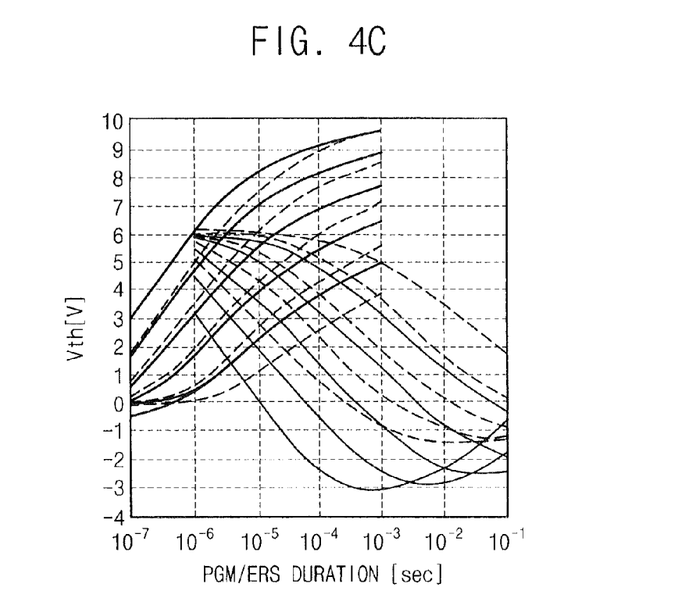

FIGS. 4A, 4B and 4C are graphs illustrating erase performance (e.g., erase saturation characteristics) of transistors having the second, third and first gate structures, respectively. The horizontal axis indicates a programming/erase duration and the vertical axis indicates a threshold voltage in each graph. Furthermore, a rising curve in each graph illustrates a change of a threshold voltage during programming and a falling curve in each graph illustrates a change of a threshold voltage during erase. The second gate structure in FIG. 4A has a multi-layered structure including a silicon oxide layer/ an aluminum oxide layer as the blocking layer pattern 230, and the third gate structure in FIG. 4B has a multi-layered structure including an aluminum oxide layer/a silicon oxide layer/an aluminum oxide layer as the blocking layer pattern 330. The first gate structure in FIG. 4C has a multi-layered structure including a silicon oxide layer/an aluminum oxide layer/a silicon oxide layer/an aluminum oxide layer as the blocking layer pattern 130. Curves of FIG. 4A (broken curves) are inserted in FIGS. 4B and 4C, for reference.

Referring to FIGS. 4A to 4C, the transistor in FIG. 4A has a saturated voltage of about −1.5V during erase (i.e., an erase saturation of about −1.5V), and the transistors in FIGS. 4B and 4C have an erase saturation of about −3.0V. That is, the transistor having the third gate structure in accordance with Comparative Example 2 or the first gate structure in accordance with example embodiments may have better erase saturation characteristics, when compared to the transistor having the second gate structure in accordance with Comparative Example 1.

The transistor having the first gate structure in accordance with example embodiments may have better interfacial characteristics (e.g., a more uniform interface between a charge trapping layer pattern and a blocking layer pattern) than those of the third gate structure in accordance with Comparative Example 2. Furthermore, the transistor having the first gate structure in accordance with example embodiments may have better erase performance, e.g., better erase saturation characteristics than those of the transistor having the second gate structure in accordance with Comparative Example 1. Therefore, the transistor having the first gate structure may have improved reliability.

Figure 5:
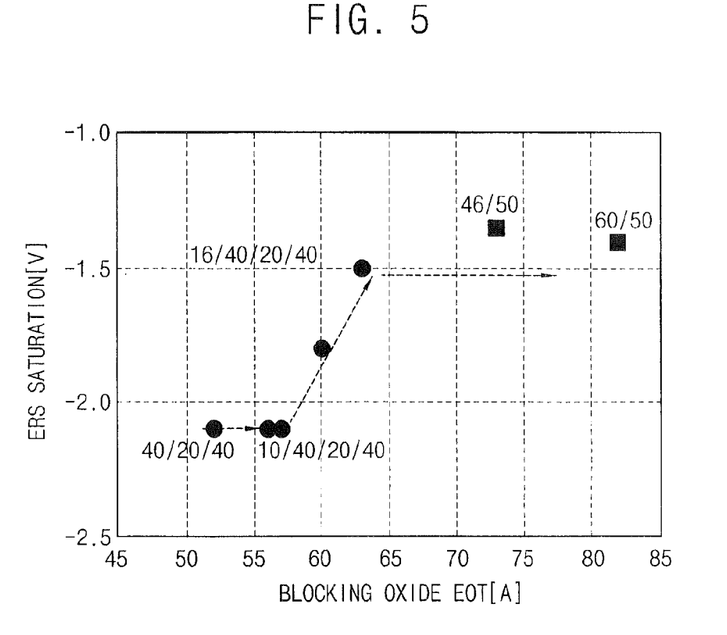
FIG. 5 is a graph illustrating a change of a saturated voltage during erase (i.e., a change of erase saturation characteristics) according to a thickness of a first silicon oxide layer pattern in a blocking layer pattern of the first gate structure, in accordance with example embodiments.

FIG. 5 is a graph illustrating a change of a saturated voltage during erase (i.e., a change of erase saturation characteristics), according to a thickness of the first silicon oxide layer pattern 132 in the blocking layer pattern 130 of the first gate structure in accordance with example embodiments. In FIG. 5, ● indicates a saturated voltage during erase (i.e., an erase saturation) of a transistor having the first gate structure of which the blocking layer pattern 130 has a multi-layered structure including a silicon oxide layer/an aluminum oxide layer/a silicon oxide layer/an aluminum oxide layer, and ■ indicates an erase saturation of a transistor having the second gate structure of which the blocking layer pattern 230 has a multi-layered structure including a silicon oxide layer/an aluminum oxide layer. The horizontal axis of the graph indicates equivalent oxide thicknesses (EOTs) of the blocking layer patterns 130 and 230, and the vertical axis indicates erase saturations of the transistors. Numbers at each point indicate thicknesses of layers in each blocking layer pattern. For example, "10/40/20/40" means thicknesses of the first silicon oxide layer, the first aluminum oxide layer, the second silicon oxide layer and the second aluminum oxide layer are 10 Å, 40 Å, 20 Å and 40 Å, respectively. "40/20/40" means that a thickness of the first silicon oxide layer is 0 Å, which corresponds to the blocking layer pattern 330 of the third gate structure.

Referring to FIG. 5, the erase saturation increases very steeply as the thickness of the first silicon oxide layer pattern 132 of the blocking layer pattern 130 varies from 10 to 16 Å, while the erase saturation does not change very much as the thickness thereof varies from 0 to 10 Å. That is, when the thickness of the first silicon oxide layer pattern 132 increases at around 10 Å, the erase saturation characteristics may deteriorate remarkably, which means the first silicon oxide layer pattern 132 may have a critical thickness of about 10 Å. Thus, the first gate structure in accordance with example embodiments may include the first silicon oxide layer pattern 132 having a thickness of about 1 to about 10 Å in the blocking layer pattern 130.

Figure 6:
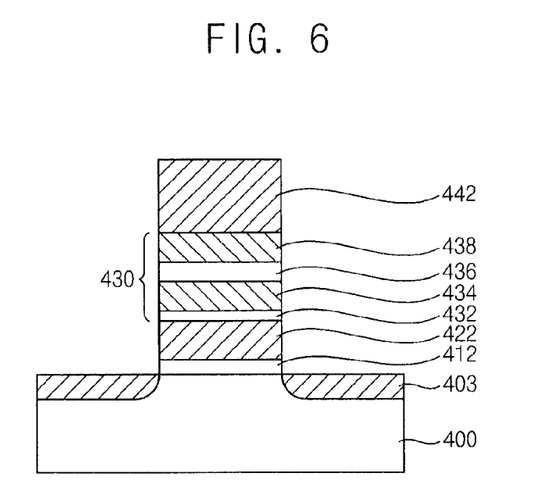
FIG. 6 is a cross-sectional view illustrating a fourth gate structure in accordance with other example embodiments.

FIG. 6 is a cross-sectional view illustrating a fourth gate structure in accordance with other example embodiments. Referring to FIG. 6, the fourth gate structure may include a tunnel insulation layer 412, a floating gate 422, a dielectric layer structure 430 and a control gate 442 sequentially stacked on a substrate 400. The floating gate 422 may include doped polysilicon or a metal having a high work function such as tungsten, titanium, cobalt, nickel, etc. The dielectric layer structure 430 may include a material substantially the same as that of the blocking layer pattern 130 of the first gate structure of FIG. 1. That is, the dielectric layer structure 430 may include a first silicon oxide layer pattern 432, a first high-k dielectric layer pattern 434, a second silicon oxide layer pattern 436 and a second high-k dielectric layer pattern 438. The control gate 442 may include a material substantially the same as that of the gate electrode 142 of the first gate structure. An impurity region 403 may be formed at an upper portion in the substrate 400 adjacent to the fourth gate structure. The fourth gate structure and the impurity region 403 may serve as a transistor of a floating gate flash memory device, and the transistor may have good erase saturation characteristics and improved reliability.

Thus, as illustrated and described hereinabove with respect to FIGS. 1 and 6, a nonvolatile memory device according to embodiments of the invention may include an array of nonvolatile memory cells (e.g., charge-trap type and floating gate type memory cells). Each of the nonvolatile memory cells may include a tunnel insulating layer (112, 412) on a substrate (100, 400) and a charge storing layer (122, 422) on the tunnel insulating layer. A charge transfer blocking layer (130, 430) is provided on the charge storing layer. This charge transfer blocking layer inhibits leakage currents passing therethrough during memory programming and erase operations. The charge transfer blocking layer may be formed as a composite of multiple layers. According to some embodiments of the invention, the charge transfer blocking layer may include a first oxide layer (132, 432) having a thickness in a range from about 1 Å to about 10 Å. This first oxide layer may be formed directly on (e.g., in contact with) the charge storing layer. The charge transfer blocking layer may also include a first dielectric layer (134, 434) on the first oxide layer. This first dielectric layer may have a higher dielectric constant relative to the first oxide layer. The charge transfer blocking layer also includes a second oxide layer (136, 436) on the first dielectric layer and a second dielectric layer (138, 438) on the second oxide layer. This second dielectric layer may have a higher dielectric constant relative to the second oxide layer. This second dielectric layer may have a thickness in a range from about 30 Å to about 100 Å. The memory cell may also include an electrically conductive electrode (142, 442) on the charge transfer blocking layer.

Figure 7:
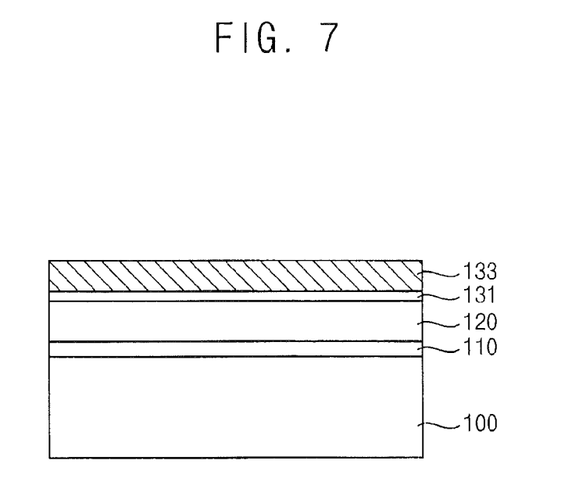
FIGS. 7 to 9 are cross-sectional views illustrating a method of manufacturing a first gate structure in accordance with example embodiments.
Figure 8:
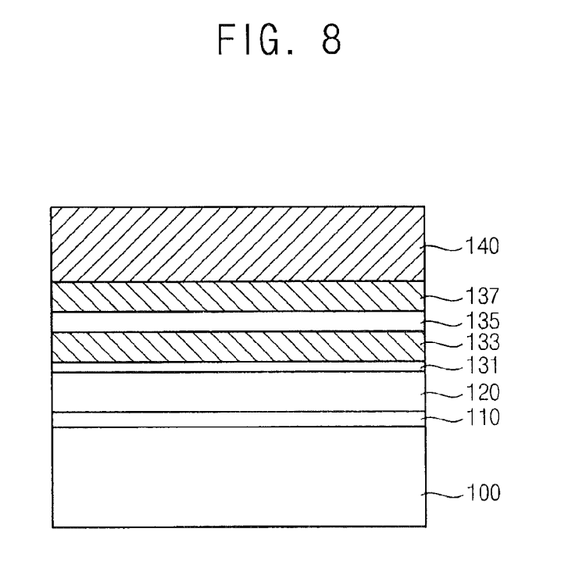
Figure 9:
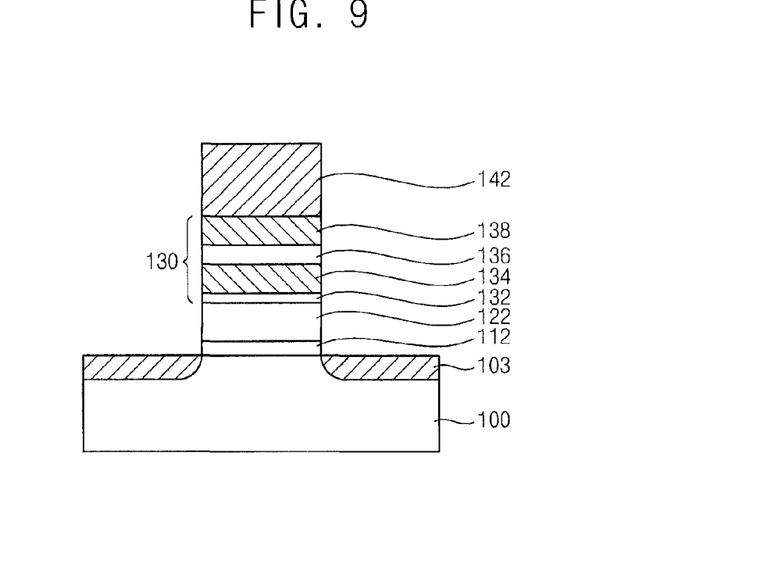

FIGS. 7 to 9 are cross-sectional views illustrating a method of manufacturing the first gate structure in accordance with example embodiments. Referring to FIG. 7, a tunnel insulation layer 110, a charge trapping layer 120, a first silicon oxide layer 131 and a first high-k dielectric layer 133 may be sequentially formed on a substrate 100. The tunnel insulation layer 110 may be formed using an oxide such as silicon oxide, a nitride such as silicon nitride or a metal oxide, by a chemical vapor deposition (CVD) process, an atomic layer deposition (ALD) process, a sputtering process, etc. Alternatively, the tunnel insulation layer 110 may be formed by a thermal oxidation process on the substrate 100. The charge trapping layer 120 may be formed using a nitride such as silicon nitride or a hafnium oxide such as hafnium silicon oxide, by a CVD process, an ALD process, a sputtering process, etc. The first silicon oxide layer 131 may be formed using silicon oxide. The first silicon oxide layer 131 may be formed to have a small thickness of about 1 to about 10 Å, and thus an ALD process may be performed to control the thickness thereof easily.

The first high-k dielectric layer 133 may be formed using a high-k material such as aluminum oxide, hafnium oxide, lanthanum oxide, lanthanum aluminum oxide, lanthanum hafnium oxide, hafnium aluminum oxide, titanium oxide, tantalum oxide, zirconium oxide, etc., by a CVD process, an ALD process, a sputtering process, etc. In an example embodiment, the first high-k dielectric layer 133 and the first silicon oxide layer 131 may be formed in situ by an ALD process.

A heat treatment may be performed at a temperature of about 800° C. to about 1100° C. after the first silicon oxide layer 131 and the first high-k dielectric layer 133 are formed.

Referring to FIG. 8, a second silicon oxide layer 135, a second high-k dielectric layer 137 and a gate electrode layer 140 may be formed sequentially on the first high-k dielectric layer 133. The second silicon oxide layer 135 may be formed using silicon oxide by a CVD process, an ALD process, a sputtering process, etc. The second silicon oxide layer 135 may have a thickness greater than that of the first silicon oxide layer 131. In an example embodiment, the second silicon oxide layer 135 may be formed to have a thickness of about 10 to 30 Å. The second high-k dielectric layer 137 may be formed using a high-k material such as aluminum oxide, hafnium oxide, lanthanum oxide, lanthanum aluminum oxide, lanthanum hafnium oxide, hafnium aluminum oxide, titanium oxide, tantalum oxide, zirconium oxide, etc., by a CVD process, an ALD process, a sputtering process, etc. In an example embodiment, the second high-k dielectric layer 137 may have a material substantially the same as that of the first high-k dielectric layer 133, and may have a thickness substantially the same as that of the first high-k dielectric layer 133.

A heat treatment may be performed at a temperature of about 800° C. to about 1100° C. after the second silicon oxide layer 135 and the second high-k dielectric layer 137 are formed. The gate electrode layer 140 may be formed using polysilicon, a metal, a metal nitride, a metal silicide, etc., by a CVD process, an ALD process, a sputtering process, etc. In an example embodiment, a polysilicon layer (not shown), an ohmic layer (not shown), a diffusion barrier layer (not shown), an amorphous layer (not shown) and a metal layer (not shown) may be sequentially stacked on the second high-k dielectric layer 137. The polysilicon layer may be formed using p-type impurities such as boron, indium, gallium, etc., or n-type impurities such as phosphorus, arsenic, antimony, etc. The ohmic layer may be formed using a metal having a high resistivity and a high melting point such as titanium, tantalum, tungsten, molybdenum or alloys thereof. The diffusion barrier layer may be formed using a metal nitride such as tungsten nitride, titanium nitride, tantalum nitride, molybdenum nitride, etc. The amorphous layer may be formed using amorphous silicon or a metal silicide having a high melting point such as amorphous titanium silicide, amorphous molybdenum silicide or amorphous tantalum silicide. The metal layer may be formed using a metal having a high melting point such as tungsten, titanium, tantalum, molybdenum, or alloys thereof.

Referring to FIG. 9, the gate electrode layer 140, the second high-k dielectric layer 137, the second silicon oxide layer 135, the first high-k dielectric layer 133, the first silicon oxide layer 131, the charge trapping layer 120 and the tunnel insulation layer 110 of FIG. 8 may be patterned sequentially using a photoresist (not shown) to form a first gate structure on the substrate 100. The first gate structure may include a tunnel insulation layer pattern 112, a charge trapping layer pattern 122, a blocking layer pattern 130 and a gate electrode 142 sequentially stacked on the substrate 100. The blocking layer pattern 130 may include a first silicon oxide layer pattern 132, a first high-k dielectric layer pattern 134, a second silicon oxide layer pattern 136 and a second high-k dielectric layer pattern 138. An ion implantation process may be performed on the substrate 100 using the first gate structure as an ion implantation mask to form an impurity region 103 at an upper portion of the substrate 100 adjacent to the first gate structure, thereby forming a transistor of a charge trap flash memory device. A transistor of a floating gate flash memory device including the fourth gate structure with reference to FIG. 6 may be formed by a method similar to the above method.

Figure 10:
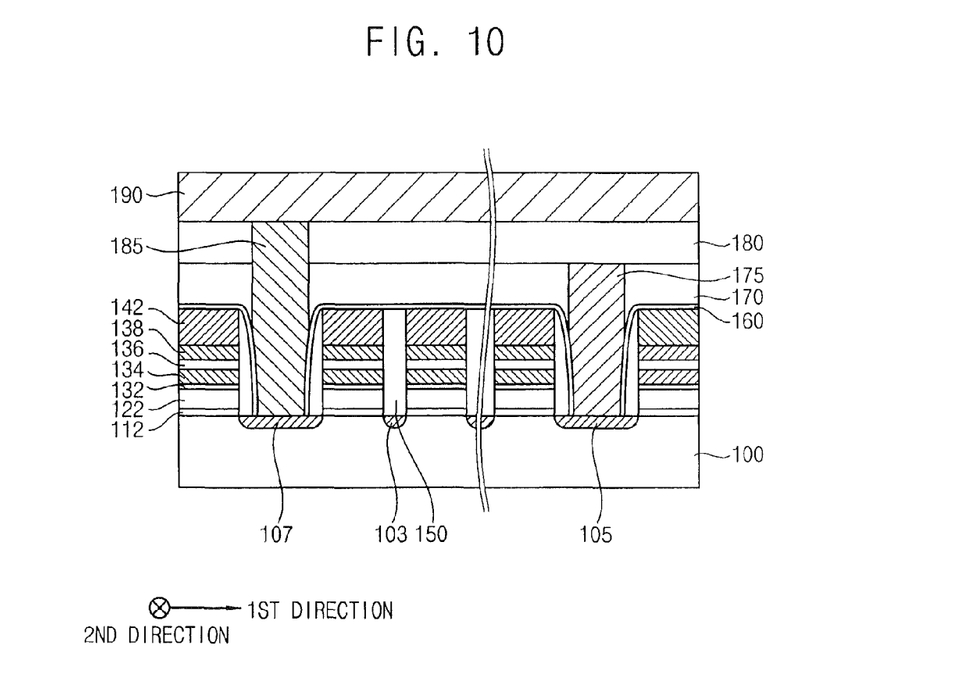
FIG. 10 is a cross-sectional view illustrating a flash memory device in accordance with example embodiments.
Figure 11:
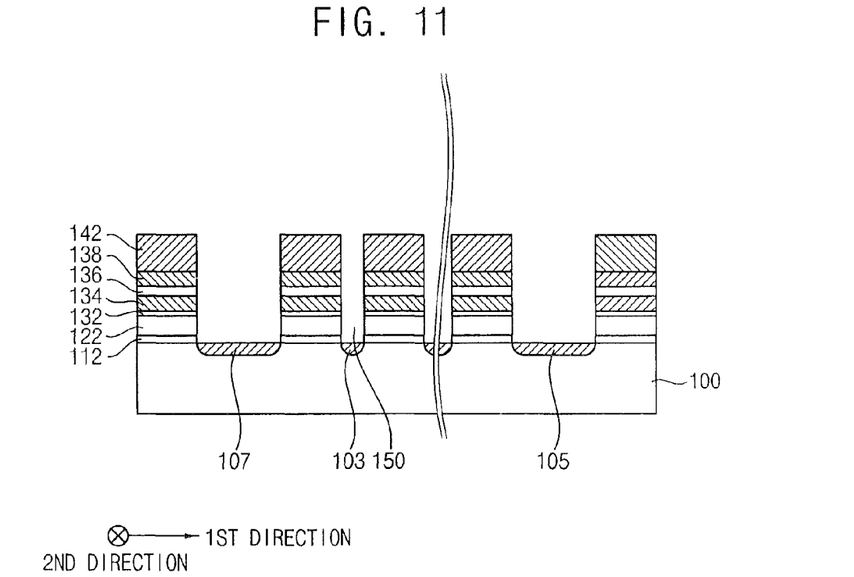
FIGS. 11 to 14 are cross-sectional views illustrating a method of manufacturing a flash memory device in accordance with example embodiments.

FIG. 10 is a cross-sectional view illustrating a flash memory device in accordance with example embodiments. Referring to FIG. 10, the flash memory device may include a plurality of the first gate structures illustrated with reference to FIG. 1, and may have first to third impurity regions 103, 105 and 107 at upper portions of a substrate 100 between the first gate structures, which are not covered by the first gate structures. Furthermore, the flash memory device may further include a common source line (CSL) 175 and a bitline 190. Alternatively, the flash memory device may include a plurality of the fourth gate structures illustrated with reference to FIG. 6, however, detailed explanations are omitted here. The first gate structures may be spaced apart from each other in a first direction, and each first gate structure may extend in a second direction perpendicular to the first direction on the substrate 100. The first impurity region 103 may be formed at a first upper portion of the substrate 100 at which a gap between the gate structures is relatively small. The second and third impurity regions 105 and 107 may be formed at second and third upper portions of the substrate 100, respectively, at which gaps between the gate structures are relatively large.

Spacers 150 may be further formed on sidewalls of the first gate structures. Furthermore, a protection layer pattern 160 may be formed on the substrate 100 to cover the first gate structure and the spacers 150. The spacers 150 and the protection layer pattern 160 may include a nitride such as silicon nitride. A first insulating interlayer 170 covering the protection layer pattern 160 may be formed on the substrate 100. The first insulating interlayer 170 may include an oxide such as borophosphosilicate glass (BPSG), undoped silicate glass (USG), spin-on glass (SOG), etc. The common source line 175 may be through the first insulating interlayer 170 and make contact with the second impurity region 105. The common source line 175 may include doped polysilicon, a metal or a metal silicide.

A second insulating interlayer 180 may be formed on the first insulating interlayer 170 and the common source line 175. The second insulating interlayer 180 may include an oxide such as BPSG, USG, SOG, etc. A bitline contact 185 may extend through the first and second insulating interlayers 170 and 180 and make contact with the third impurity region 107. A bitline 190 electrically connected to the bitline contact 185 may be formed on the second insulating interlayer 180. The bitline contact 185 and the bitline 190 may include a metal, a metal silicide, doped polysilicon, etc. The bitline 190 may extend in the first direction. As described above, the flash memory device having the first gate structures may have good erase performance and improved reliability. FIG. 10 illustrates a NAND flash memory device, however, it is obvious to those skilled in the art to which this inventive concept belongs that the inventive concept of the present invention may be applied to a NOR flash memory device including the first or fourth gate structures.

FIGS. 11 to 14 are cross-sectional views illustrating a method of manufacturing a flash memory device in accordance with example embodiments. Referring FIG. 11, a plurality of first gate structures and first to third impurity regions 103, 105 and 107 may be formed on or at a substrate 100 by performing processes illustrated above with reference to FIGS. 7 to 9. Each first gate structure may be formed to extend in a second direction, and the first gate structures may be formed to be spaced apart from each other in a first direction perpendicular to the second direction.

Figure 12:
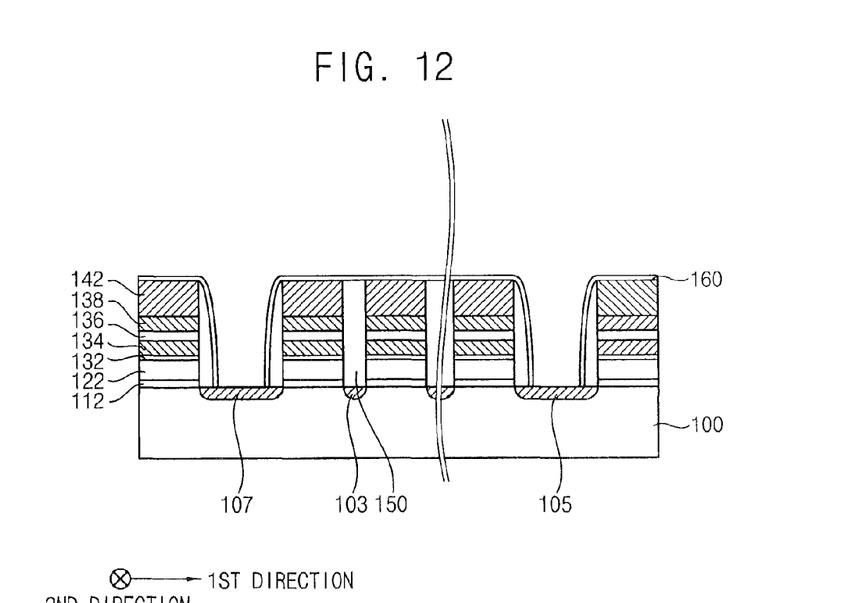

Referring to FIG. 12, a spacer layer may be formed on the substrate 100 to cover the first gate structures. The spacer layer may be formed using a nitride such as silicon nitride by a CVD process, an ALD process, a sputtering process, etc. The spacer layer may be etched by an anisotropic etching process to form spacers 150 on sidewalls of the first gate structures. A protection layer may be formed on the substrate 100 to cover the spacers 150 and the first gate structures. The protection layer may be formed using a nitride such as silicon nitride by a CVD process, an ALD process, a sputtering process, etc. The protection layer may be partially etched by an anisotropic etching process to form a protection layer pattern 160 on the spacers 150 and the first gate structures.

Figure 13:
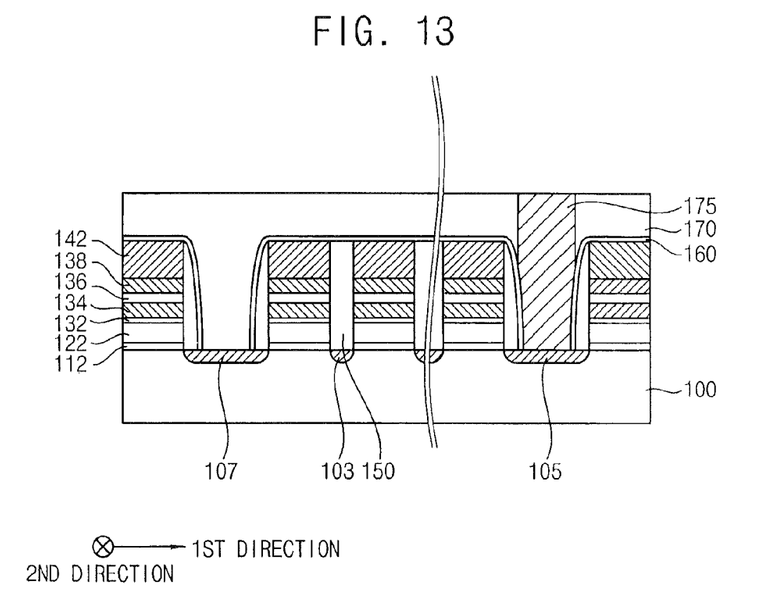

Referring to FIG. 13, a first insulating interlayer 170 may be formed on the substrate 100 to cover the protection layer pattern 160. The first insulating interlayer 170 may be formed using an oxide such as BPSG, USG, SOG, etc. by a CVD process, an ALD process, a sputtering process, etc. A first hole (not shown) may be formed through the first insulating interlayer 170 to expose the second impurity region 105. A first conductive layer may be formed on the exposed second impurity region 105 and the first insulating interlayer 170 to fill the first hole. The first conductive layer may be formed using doped polysilicon, a metal and/or a metal silicide. An upper portion of the first conductive layer may be planarized until the first insulating interlayer 170 is exposed, thereby to form a common source line 175 contacting the second impurity region 105 and filling the first hole.

Figure 14:
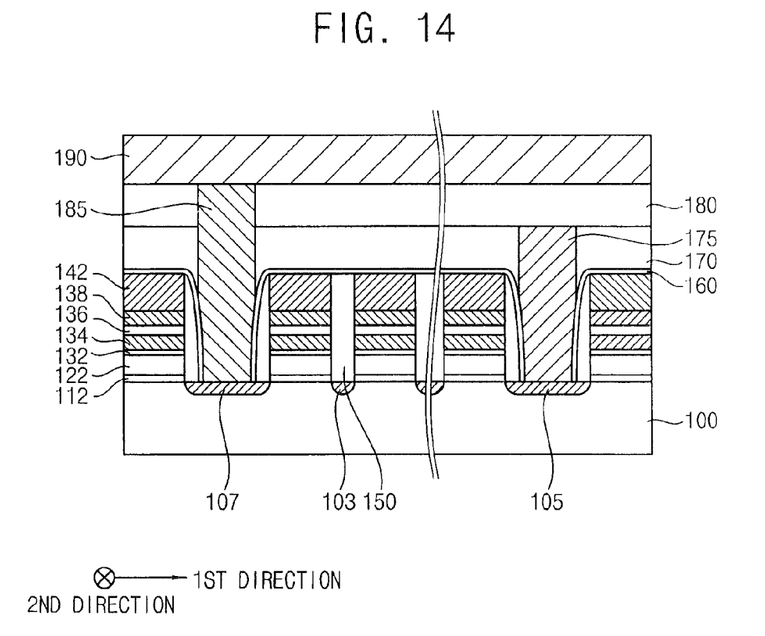

Referring to FIG. 14, a second insulating interlayer 180 may be formed on the first insulating interlayer 170 and the common source line 175. The second insulating interlayer 180 may be formed using an oxide such as BPSG, USG, SOG, etc. by a CVD process, an ALD process, a sputtering process, etc.

A second hole (not shown) may be formed through the first and second insulating interlayer 170 and 180 to expose the third impurity region 107. A second conductive layer may be formed on the third impurity region 107 and the second insulating interlayer 180 to fill the second hole. The second conductive layer may be formed using doped polysilicon, a metal or a metal silicide. An upper portion of the second conductive layer may be planarized until the second insulating interlayer 180 is exposed, thereby to form a bitline contact 185 contacting the third impurity region 107 and filling the second hole.

A third conductive layer may be formed on the second insulating interlayer 180 and the bitline contact 185. The third conductive layer may be formed using doped polysilicon, a metal and/or a metal silicide. The third conductive layer may be patterned to extend in the first direction, thereby forming a bitline 190 electrically connected to the bitline contact 185. By performing the processes illustrated above, the flash memory device in accordance with example embodiments may be manufactured.

Figure 15:
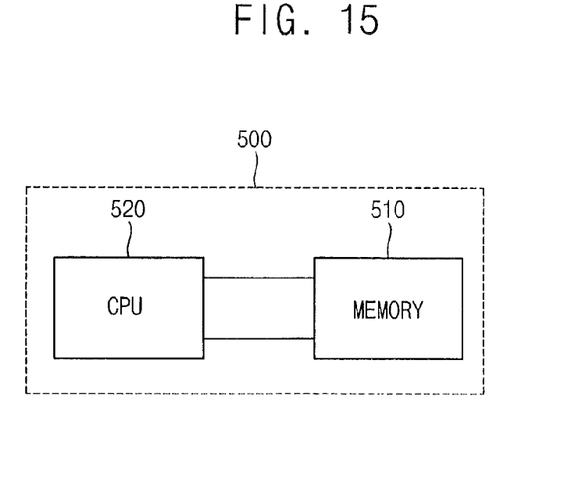
FIG. 15 is a block diagram illustrating a memory system having a flash memory device in accordance with example embodiments.

FIG. 15 is a block diagram illustrating a memory system having the flash memory device in accordance with example embodiments. Referring to FIG. 15, a memory 510 such as a flash memory device may be electrically connected to a central processing unit (CPU) 520 in the memory system 500 such as a computer. The memory system 500 may include a personal computer, a personal digital assistance (PDA), etc. The memory 510 may be directly connected to the CPU 520, or indirectly connected to the CPU 510 via buses. The memory 510 may include the gate structures in accordance with example embodiments, which have been previously illustrated. Thus, the memory 510 may have good erase performance and improved reliability, and thus, the memory system 500 may have improved performance.

Figure 16:
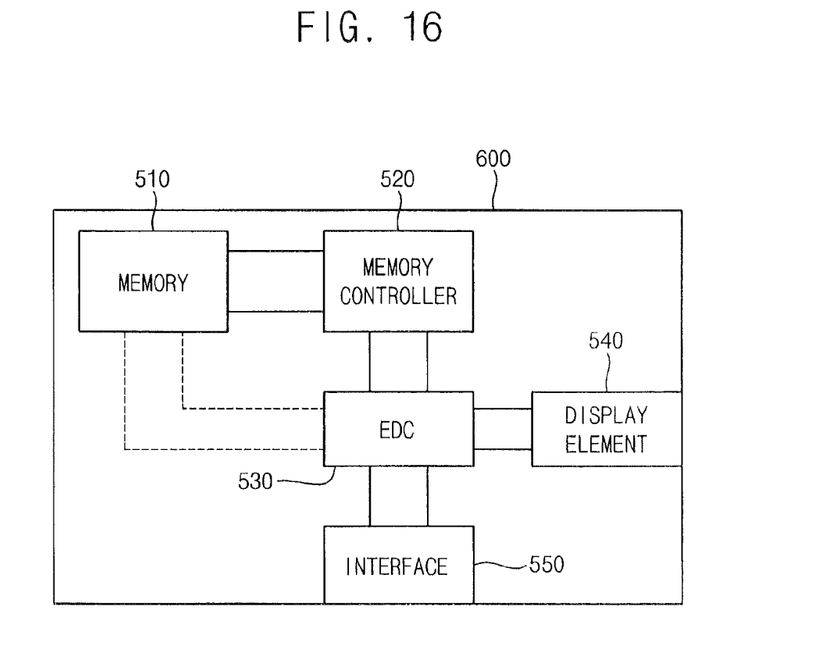
FIG. 16 is a block diagram illustrating a memory system having a flash memory device in accordance with example embodiments.

FIG. 16 is a block diagram illustrating a memory system having the flash memory device in accordance with example embodiments. Referring to FIG. 16, the memory system 600 may include a portable electronic device. For example, the memory system 600 may be a portable media player (PMP), a wireless communication device, an MP3 player, an electronic dictionary, etc. The memory system 600 may have a memory 510, a memory controller 520, an encoder/decoder (EDC) 530, a display element 540 and an interface 550. The memory 510 may be the flash memory device in accordance with example embodiments. The memory 510 may include the gate structures in accordance with example embodiments, which have been previously illustrated.

The EDC 530 may encode data to be stored in the memory 510. For example, the EDC 530 may execute encoding for storing audio data and/or video data in the memory 510 of a PMP or an MP3 player. Furthermore, the EDC 530 may execute MPEG encoding for storing video data in the memory 510. The EDC 530 may include multiple encoders to encode different types of data depending on their formats. For example, the EDC 530 may include an MP3 encoder for encoding audio data and an MPEG encoder for encoding video data.

The EDC 530 may also decode data being output from in the memory 510. For example, the EDC 530 may decode MP3 audio data from the memory 510. Furthermore, the EDC 530 may decode MPEG video data from the memory 510. The EDC 530 may include multiple decoders to decode different types of data depending on their formats. For example, the EDC 530 may include an MP3 decoder for audio data and an MPEG decoder for video data.

The EDC 530 may include only a decoder. For example, encoded data may be input to the EDC 530, and then the EDC 530 may decode the input data and transfer the decoded data to the memory controller 520 or the memory 510.

The EDC 530 may receive data to be encoded or data being encoded by way of the interface 550. The interface 550 may be compliant with standard input devices, e.g. FireWire, or a USB. That is, the interface 550 may include a FireWire interface, an USB interface or the like. Data may be output from the memory 510 by way of the interface 550.

The display element 540 may display to an end-user data output from the memory 510 and decoded by the EDC 530. For example, the display element 540 may be an audio speaker or a display screen.

Accordingly, the memory device 510 in accordance with example embodiments may be highly integrated and may have a high capacitance, while providing good electrical characteristics. Thus, the memory system 600 including the memory device 510 may have an improved performance.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A gate structure, comprising:
   a tunnel insulation layer pattern on a substrate;
   a charge trapping layer pattern on the tunnel insulation layer pattern;
   a blocking layer pattern on the charge trapping layer pattern, the blocking layer including:
   a first silicon oxide layer pattern having a thickness in a range from about 1 Å to about 10 Å, on the charge trapping layer pattern;
   a first high-k dielectric layer pattern on the first silicon oxide layer pattern;
   a second silicon oxide layer pattern on the first high-k dielectric layer pattern; and
   a second high-k dielectric layer pattern on the second silicon oxide layer pattern; and
   a gate electrode on the blocking layer pattern.

2. The gate structure of claim 1, wherein the second high-k dielectric layer pattern has a thickness of about 30 to about 100 Å.

3. The gate structure of claim 1, wherein the blocking layer pattern consists of the first silicon oxide layer pattern, the first high-k dielectric layer pattern, the second silicon oxide layer pattern, and the second high-k dielectric layer pattern.

4. The gate structure of claim 1, wherein the first and second high-k dielectric layer patterns comprise at least one selected from the group consisting of aluminum oxide, hafnium oxide, zirconium oxide, lanthanum oxide, lanthanum hafnium oxide and hafnium aluminum oxide.

5. The gate structure of claim 4, wherein the first and second high-k dielectric layer patterns include aluminum oxide.

6. A nonvolatile memory device, comprising:
   a tunnel insulating layer on a substrate;
   a charge storing layer on said tunnel insulating layer;
   a charge transfer blocking layer on said charge storing layer, said charge transfer blocking layer comprising:

a first oxide layer having a thickness in a range from about 1 Å to about 10 Å, on the charge storing layer;

a first dielectric layer on the first oxide layer, said first dielectric layer having a higher dielectric constant relative to the first oxide layer;

a second oxide layer on the first dielectric layer, said second oxide layer having a greater thickness than the first oxide layer; and a second dielectric layer on the second oxide layer, said second dielectric layer having a higher dielectric constant relative to the second oxide layer; and an electrically conductive electrode on said charge transfer blocking layer.

7. The nonvolatile memory device of claim 6, wherein the second oxide layer has a thickness in a range from about 10 Å to about 30 Å.

8. The nonvolatile memory device of claim 6, wherein said charge storing layer comprises a material selected from a group consisting of silicon nitride and hafnium silicon oxide; and wherein the nonvolatile memory device is a charge-trap type nonvolatile memory device.

9. The nonvolatile memory device of claim 6, wherein the second dielectric layer has a thickness in a range from about 30 Å to about 100 Å.

10. The nonvolatile memory device of claim 6, wherein said charge transfer blocking layer directly contacts said charge storing layer; wherein the first dielectric layer directly contacts the first oxide layer; and wherein the second dielectric layer directly contacts the second oxide layer.

11. The nonvolatile memory device of claim 6, wherein the charge transfer blocking layer consists of the first oxide layer, the first dielectric layer, the second oxide layer, and the second dielectric layer.

12. A nonvolatile memory device, comprising:

a tunnel insulating layer on a substrate;

a charge storing layer on said tunnel insulating layer;

a charge transfer blocking layer on said charge storing layer, said charge transfer blocking layer comprising:

a first oxide layer having a thickness in a range from about 1 Å to about 10 Å, on the charge storing layer;

a first dielectric layer on the first oxide layer, said first dielectric layer having a higher dielectric constant relative to the first oxide layer;

a second oxide layer on the first dielectric layer; and a second dielectric layer on the second oxide layer, said second dielectric layer having a higher dielectric constant relative to the second oxide layer; and an electrically conductive electrode on said charge transfer blocking layer.

13. The nonvolatile memory device of claim 12, wherein the first and second dielectric layers comprise the same material.

14. The nonvolatile memory device of claim 12, wherein the first dielectric layer comprises a material selected from a group consisting of aluminum oxide, hafnium oxide, zirconium oxide, lanthanum oxide, lanthanum hafnium oxide and hafnium aluminum oxide.

15. The nonvolatile memory device of claim 12, wherein said charge storing layer comprises a material selected from group consisting of silicon nitride and hafnium silicon oxide; and wherein the nonvolatile memory device is a charge-trap type nonvolatile memory device.

16. The nonvolatile memory device of claim 12, wherein the second dielectric layer has a thickness in a range from about 30 Å to about 100 Å.

17. The nonvolatile memory device of claim 12, wherein the charge transfer blocking layer consists of the first oxide layer, the first dielectric layer, the second oxide layer, and the second dielectric layer.

18. The nonvolatile memory device of claim 12, where said charge storing layer comprises polycrystalline silicon and operates as a floating gate electrode.

19. The nonvolatile memory device of claim 12, wherein said charge transfer blocking layer directly contacts said charge storing layer; wherein the first dielectric layer directly contacts the first oxide layer; and wherein the second dielectric layer directly contacts the second oxide layer.

20. The nonvolatile memory device of claim 19, wherein said electrically conductive electrode directly contacts the second dielectric layer.

* * * * *